United States Patent

Ashizawa (10) Patent No.: US 10,121,556 B2
(45) Date of Patent: Nov. 6, 2018

(54) DESIGNING METHOD OF SEMICONDUCTOR DEVICE AND SEMICONDUCTOR DEVICE

(71) Applicant: Socionext Inc., Yokohama-shi, Kanagawa (JP)

(72) Inventor: Tetsuo Ashizawa, Kasugai (JP)

(73) Assignee: SOCIONEXT INC., Yokohama (JP)

( * ) Notice: Subject to any disclaimer, the term of this patent is extended or adjusted under 35 U.S.C. 154(b) by 332 days.

(21) Appl. No.: 14/968,116

(22) Filed: Dec. 14, 2015

(65) Prior Publication Data

US 2016/0225464 A1 Aug. 4, 2016

(30) Foreign Application Priority Data

Jan. 29, 2015 (JP) .................. 2015-015649

(51) Int. Cl.
  *G11C 29/38* (2006.01)
  *G11C 29/36* (2006.01)
(52) U.S. Cl.
  CPC .............. *G11C 29/36* (2013.01); *G11C 29/38* (2013.01); *G11C 2029/3602* (2013.01)
(58) Field of Classification Search
  CPC .............. G06F 17/5068; G06F 17/5072; G06F 17/5081; G11C 29/38
  See application file for complete search history.

(56) References Cited

U.S. PATENT DOCUMENTS 6,163,862 A  12/2000  Adams et al.

FOREIGN PATENT DOCUMENTS

| JP | 11-316263 A | 11/1999 |
| JP | 2000-111618 A | 4/2000 |
| JP | 2006-114785 A | 4/2006 |

*Primary Examiner* — Vuthe Siek
*Assistant Examiner* — Aric Lin
(74) *Attorney, Agent, or Firm* — Arent Fox LLP (57) ABSTRACT

A memory circuit with a built-in memory BIST circuit is created by: arranging a block of a clock pulse generator and a plurality of blocks of input/output circuits each corresponding to each of inputted/outputted bits adjacently in a first direction; arranging a block of a BIST pattern generator of the memory BIST circuit which is laid out so that signal wiring is connected by being arranged adjacently and performs generation of a test pattern, adjacently to the block of the clock pulse generator in a second direction; and arranging a plurality of blocks of comparators of the memory BIST circuit which are laid out so that signal wirings are connected by being arranged adjacently and compare an output value and an expected value, adjacently to the plurality of blocks of the input/output circuits in the second direction with the same pitch as that of the input/output circuits.

3 Claims, 9 Drawing Sheets

DESIGNING METHOD OF SEMICONDUCTOR DEVICE AND SEMICONDUCTOR DEVICE

CROSS-REFERENCE TO RELATED APPLICATION

This application is based upon and claims the benefit of priority of the prior Japanese Patent Application No. 2015-015649 filed on Jan. 29, 2015, the entire contents of which are incorporated herein by reference.

FIELD

The embodiments discussed herein are directed to a designing method of a semiconductor device including a memory BIST (built-in self test) circuit and a semiconductor device.

BACKGROUND

Figure 10A:
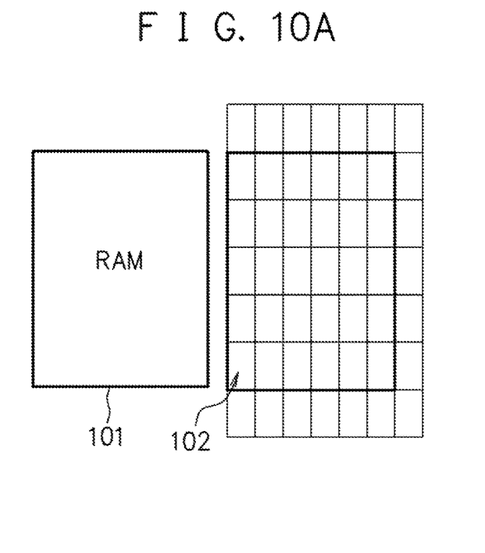
FIG. 10A and FIG. 10B are diagrams illustrating arrangement examples of the memory circuit and the memory BIST circuit.
Figure 10B:
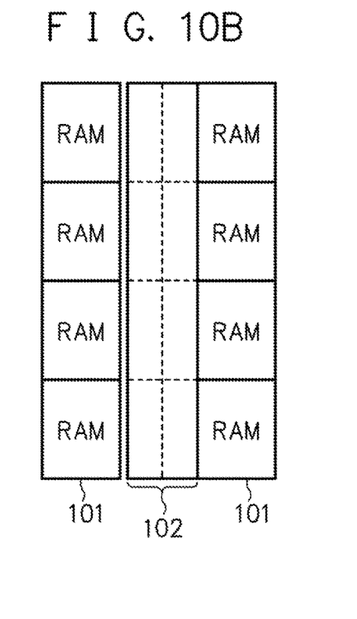

In layout design of a semiconductor device including a memory circuit and a memory BIST circuit (self-diagnostic circuit) for testing the memory circuit, generally, the memory BIST circuit is arranged in a vicinity of the memory circuit so that timing is easily met in timing verification. As illustrated in FIG. 10A and FIG. 10B, an arrangement region 102 where unit cells can be placed is provided in a vicinity of a memory circuit 101, and unit cells which constitute a memory BIST circuit are arranged in the region 102.

Figure 11A:
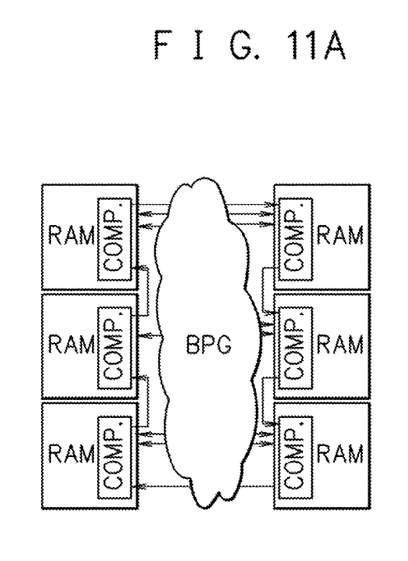
FIG. 11A and FIG. 11B are diagrams illustrating examples in which a part of the memory BIST circuit is built in the memory circuits.
Figure 11B:
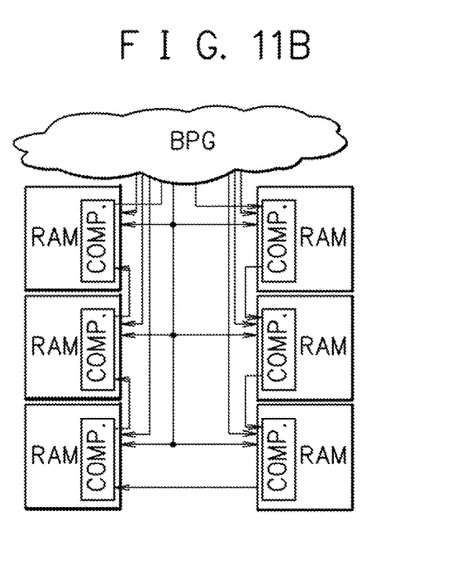

In order to realize fast operation and reduction of a circuit area, there is a manner that a part of the memory BIST circuit is built in the memory circuit. For example, as illustrated in FIG. 11A, comparators (COMP.) of the memory BIST circuit which compare whether an expected value matches an output value of a memory circuit or not are built in the memory circuits. A BIST pattern generator (BPG) which performs generation of a test data pattern and execution control is arranged between the memory circuits. For example, as illustrated in FIG. 11B, the comparators (COMP.) of the memory BIST circuit are built in the memory circuits, and the BIST pattern generator (BPG) is arranged in a core region (normal logic circuit region) without setting a region where unit cells can be placed between the memory circuits. Further, Patent Documents 1 to 3 disclose examples of memory circuits in which memory BIST circuits are built.

[Patent Document 1] Japanese Laid-open Patent Publication No. 2006-114785

[Patent Document 2] Japanese Laid-open Patent Publication No. 2000-111618

[Patent Document 3] Japanese Laid-open Patent Publication No. 11-316263

Along with miniaturization of a semiconductor device, in reducing an area related to a memory BIST circuit, wiring congestion between memory circuits hinders reduction of a circuit area (chip area). For example, when the region where unit cells can be placed is set between memory circuits in order to arrange the memory BIST circuit in a vicinity of the memory circuit, wiring resource is used for supplying power to hinder the reduction of the circuit area (chip area).

As described above, in order to realize the fast operation and the reduction of the circuit area, there is a manner that the comparator of the memory BIST circuit is built in the memory circuit. However, in the case of such an arrangement as illustrated in FIG. 11A, in order to arrange the BIST pattern generator (BPG) of the memory BIST circuit between the memory circuits, the region where the unit cells can be placed is set. Therefore, for supplying power to the region where the unit cells can be placed set between the memory circuits, the wiring characteristic of the semiconductor device (chip) has been left impaired.

In the case of such an arrangement as illustrated in FIG. 11B, signal wiring from a system logic circuit and signal wiring of the memory BIST circuit concentrate, so that the wiring characteristic is poor. Further, since a distance between the BIST pattern generator (BPG) of the memory BIST circuit and the memory circuits subjected to a test increases, there is a problem that a timing adjustment at a time of testing at speed becomes difficult.

Figure 12:
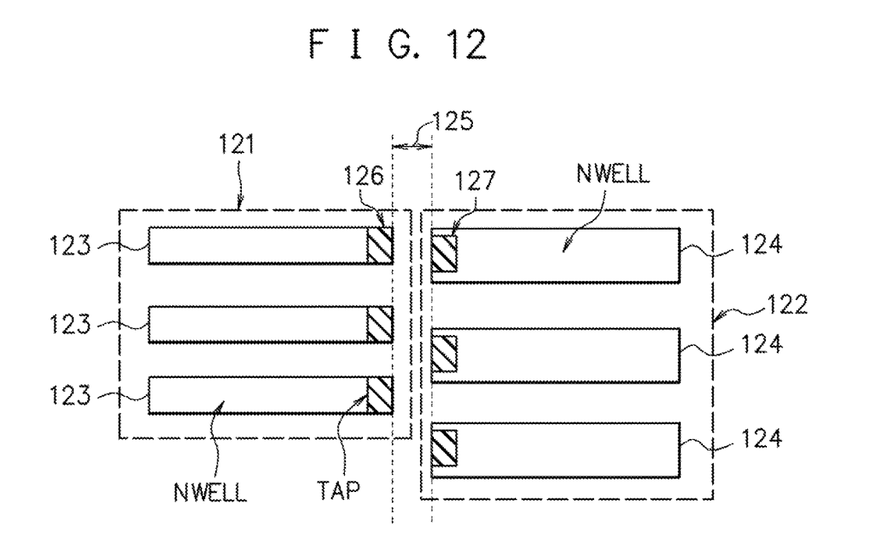
FIG. 12 is a diagram illustrating an example of wells in the memory circuit and a region where unit cells can be placed.

Further, the region where the unit cells can be placed is provided between the memory circuits, whereby a useless region occurs in a well in the semiconductor device. As illustrated in FIG. 12, intervals between wells 123 in a memory circuit 121 are determined by a pitch of memory cells in the memory circuit, but intervals between wells 124 in a region 122 where the unit cells can be placed are determined irrelevantly thereto. Therefore, in order to keep a design rule (prevention of a short circuit between wells), a certain interval 125 is provided between the wells 123 in the memory circuit 121 and the wells 124 in the region 122. Since the wells 123 in the memory circuit 121 and the wells 124 in the region 122 separate from each other, TAPs 126, 127 are provided on the wells 123, 124 respectively, resulting in increased area.

SUMMARY

One aspect of a designing method of a semiconductor device is a designing method of the semiconductor device in which a processor executes design of the semiconductor device including a memory circuit with a memory built-in self test circuit therein, and the processor arranges a block of a pulse generator and a plurality of blocks of input and output circuits adjacently in a first direction. The input and output circuits input and output data and are each arranged corresponding to each of bits of data to be inputted and outputted. Further, the processor arranges a block of a pattern generator of the memory built-in self test circuit adjacently to the block of the pulse generator in a second direction, and arranges a same number of a plurality of blocks of comparators of the memory built-in self test circuit as a number of the plurality of blocks of the input and output circuits adjacently to the plurality of blocks of the input and output circuits in the second direction with a same pitch as a pitch of the plurality of blocks of the input and output circuit. The pattern generator performs generation of a test pattern and is laid out so that signal wiring is connected between the pattern generator and the pulse generator by being arranged adjacently to the pulse generator. And each of the comparators compare an output value to be supplied from each of the input and output circuits respectively and an expected value to be supplied from the pattern generator and are laid out so that signal wirings are connected between the comparators and the input and output circuits by being arranged adjacently to the input and output circuits.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments will be described based on the drawings.

Figure 1:
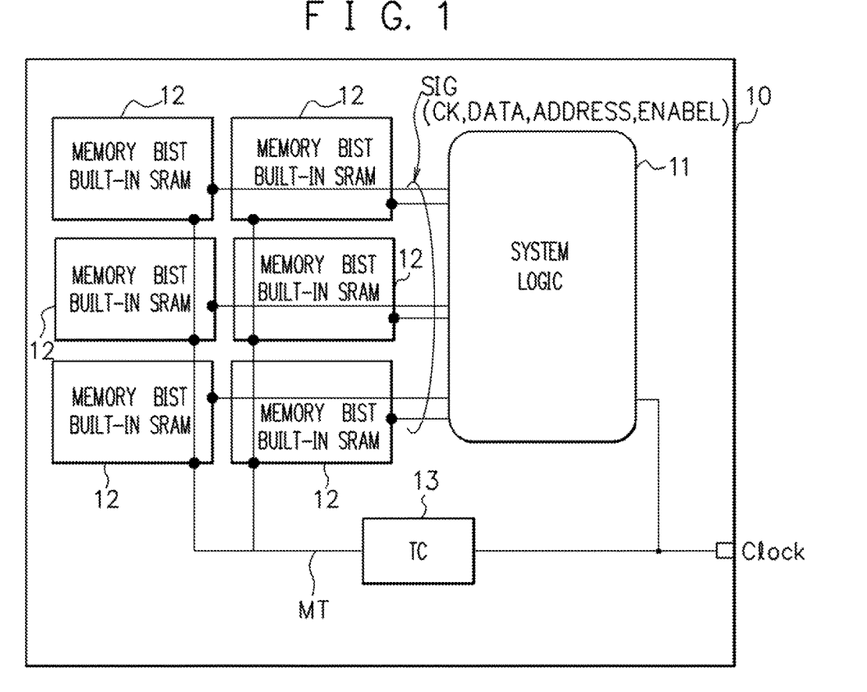
FIG. 1 is a diagram illustrating a configuration example of a semiconductor device in an embodiment.

FIG. 1 is a diagram illustrating a configuration example of a semiconductor device in an embodiment. A semiconductor device 10 in this embodiment is an SoC (System on a Chip) in which, for example, a plurality of functions are mounted on a chip. The semiconductor device 10 includes a system logic circuit 11, memory circuits with built-in memory BIST (built-in self test) circuits 12, and a test control circuit 13.

The system logic circuit 11 performs control for each of functional parts in the semiconductor device 10 and performs various processing and operations. The system logic circuit 11 inputs and outputs a signal SIG (clock signal CK (CLOCK), data signal DATA, address signal ADDRESS, enable signal ENABLE, and the like) to and from the memory circuits 12 to read and write data.

The memory circuit 12 with the built-in memory BIST circuit includes a memory circuit which stores and holds the data, and a memory BIST circuit (self-diagnostic circuit) for testing the memory circuit. The memory circuit which stores and holds the data is a memory circuit including, for example, an SRAM (Static Random Access Memory) cell. The memory BIST circuit built in the memory circuit 12 includes a BIST pattern generator which performs generation of a test data pattern and execution control, and a comparator which compares whether or not an output value to be outputted from the memory circuit which stores and holds the data matches an expected value to be supplied from the BIST pattern generator. The test control circuit 13 outputs a memory BIST operation control signal MT which controls whether or not to operate the memory BIST circuit built in the memory circuit 12, in other words, whether or not to perform a test in the memory circuit.

Figure 2:
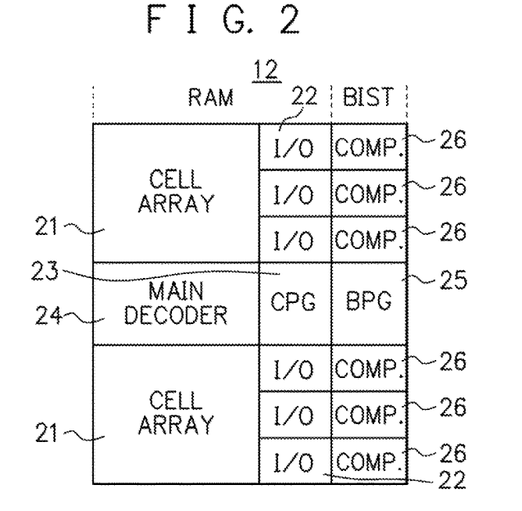
FIG. 2 is a diagram illustrating a configuration example of a memory circuit with a built-in memory BIST circuit in this embodiment.

FIG. 2 is a diagram illustrating a configuration example of the memory circuit 12 with the built-in memory BIST circuit in this embodiment. In FIG. 2, a layout example of a circuit arrangement in the semiconductor device (chip) 10 is illustrated. The memory circuit 12 with the built-in memory BIST circuit includes the memory circuit which stores and holds the data and the memory BIST circuit as described above.

The memory circuit which stores and holds the data includes cell array units 21, input/output circuits (I/O) 22, a clock pulse generator (CPG) 23, and a main decoder 24. The memory BIST circuit includes a BIST pattern generator (BPG) 25 and comparators (COMP.) 26. Each of the input/output circuits 22 of the memory circuit and each of the comparators (COMP.) 26 of the memory BIST circuit are provided for each of bits in input/output to and from the memory circuit, namely, in units of one bit. Note that the configuration illustrated in FIG. 2 is an example, and appropriate numbers of the cell array units 21, the input/output circuits 22, and the comparators 26 are arranged according to specifications and the like.

As illustrated in FIG. 2, the BIST pattern generator 25 of the memory BIST circuit is a width according to that of the main decoder 24 (for example, a width similar thereto) and is arranged next to the clock pulse generator 23 of the memory circuit so as to come in contact with the clock pulse generator 23. The comparator 26 of the memory BIST circuit is a width according to that of one bit of the memory circuit (for example, a width similar to that of one bit (a width of the input/output circuit 22)), and is arranged next to the corresponding input/output circuit 22 of the memory circuit so as to connect with the input/output circuit 22. In other words, the comparator 26 of the memory BIST circuit is repeatedly arranged with the same pitch as that of the input/output circuits 22 of the memory circuit.

Figure 3:
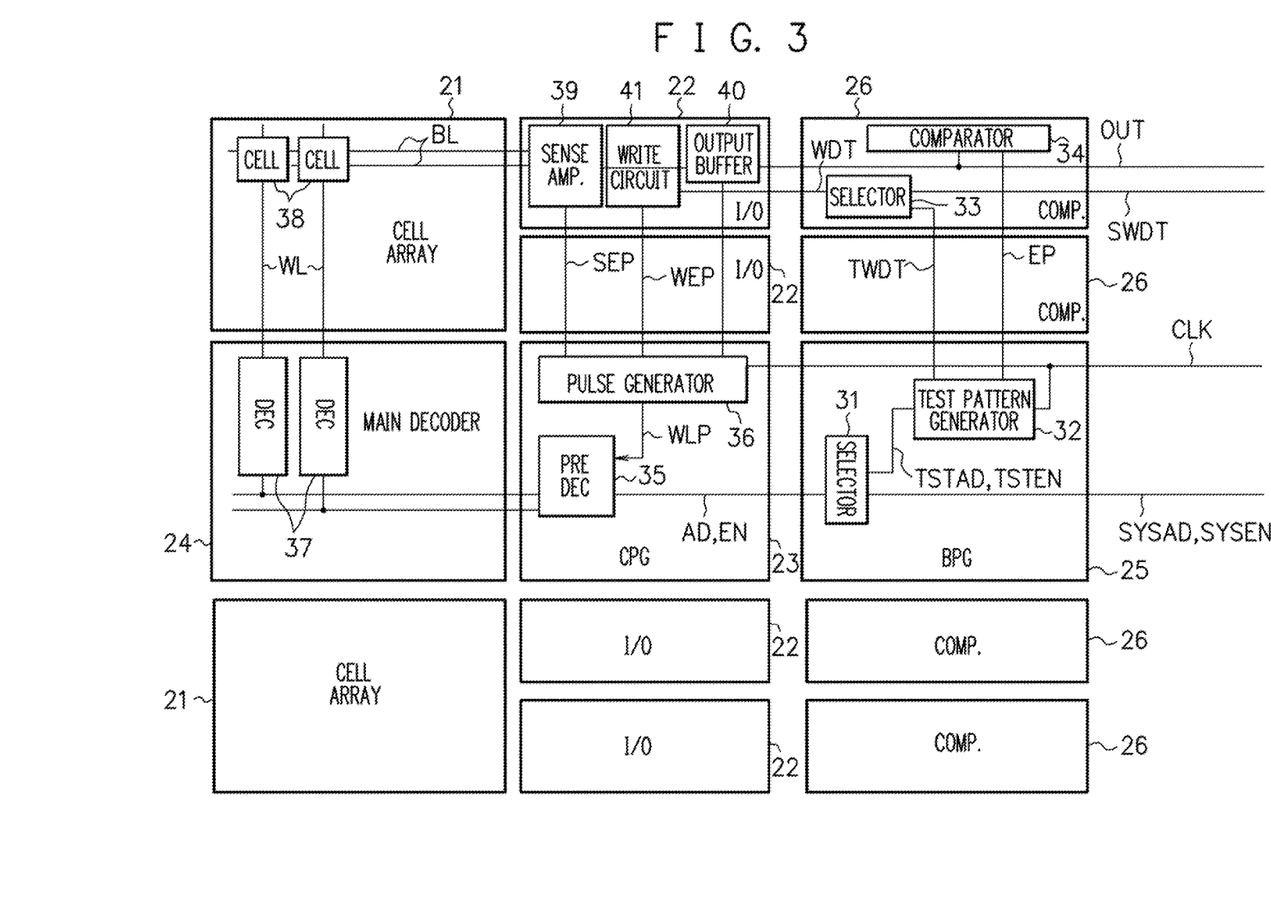
FIG. 3 is a diagram illustrating a functional configuration example of the memory circuit with the built-in memory BIST circuit in this embodiment.

FIG. 3 is a diagram illustrating a functional configuration example in the memory circuit 12 with the built-in memory BIST circuit in this embodiment. In this FIG. 3, the same components as those illustrated in FIG. 2 are denoted by the same reference signs.

The BIST pattern generator (BPG) 25 includes a selector 31 and a test pattern generator 32. The selector 31 selects and outputs an address signal SYSAD and an enable signal SYSEN to be supplied from the system logic circuit 11 or an address signal TSTAD and an enable signal TSTEN to be supplied from the test pattern generator 32. The selector 31, in response to the memory BIST operation control signal MT, selects and outputs the address signal SYSAD and the enable signal SYSEN from the system logic circuit 11 in a normal operation (in a system operation), and selects and outputs the address signal TSTAD and the enable signal TSTEN from the test pattern generator 32 in a memory BIST operation.

Figure 4:
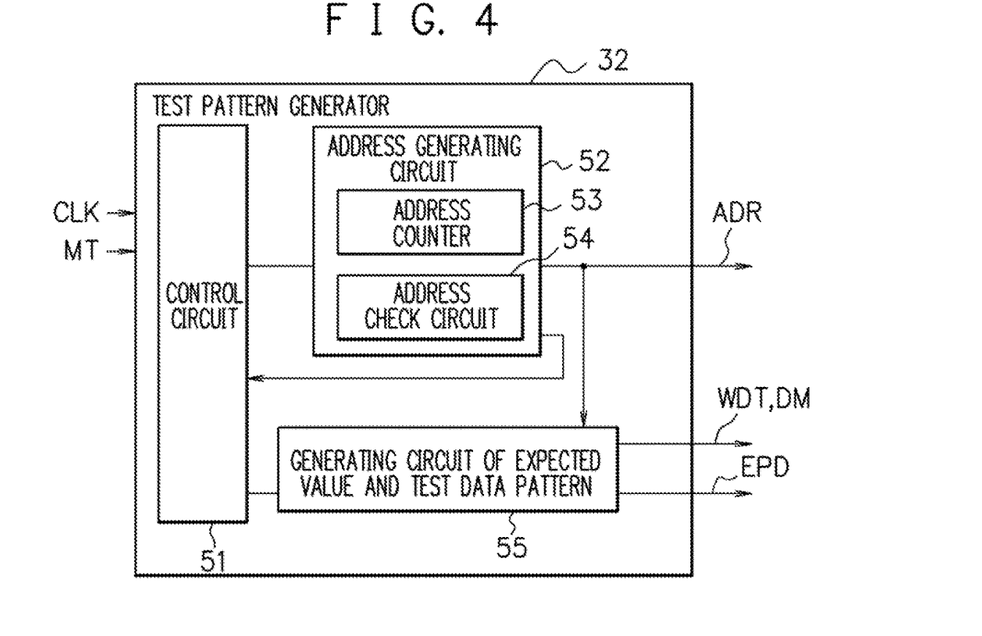
FIG. 4 is a diagram illustrating a configuration example of a test pattern generator in this embodiment.

The test pattern generator 32 generates and outputs the address signal TSTAD, the enable signal TSTEN, a write data signal (data signal for writing) TWDT, and an expected value EP related to the memory BIST. The test pattern generator 32 includes, as illustrated in FIG. 4, a control circuit 51, an address generating circuit 52, and a generating circuit 55 of an expected value and test data pattern. The test pattern generator 32 receives, for example, input of a clock signal CLK and the memory BIST operation control signal MT, and outputs an address signal ADR, a write data signal WDT, a data mask signal DM, and an expected value EPD.

The control circuit 51 is, for example, a state machine and performs execution control and the like of the memory BIST. The address generating circuit 52 includes an address counter 53 and an address check circuit 54, and generates the address signal ADR used in the memory BIST. The address counter 53 includes a counter with a maximum configuration which satisfies a support range of the memory circuit 12 with the built-in memory BIST circuit, and increments or decrements the counter to generate an address until the address check circuit 54 outputs an end signal. The counter with the maximum configuration which satisfies the support range of the memory circuit 12 is, for example, a counter to be able to generate a maximum address defined by the specifications and the like.

The address check circuit 54 stores a maximum value and a minimum value of an address value in the memory BIST, and outputs the end signal to the address counter 53 and the control circuit 51 when it is detected that the address generated by the address counter 53 reaches the maximum value or the minimum value. Therefore, in the case of a memory circuit being a small configuration, it becomes possible to halt a test pattern in accordance with the size of the memory circuit so that the test pattern does not go to the last. Upon receipt of the end signal from the address check circuit 54, the control circuit 51 advances a generating state of the test pattern.

Figure 5:
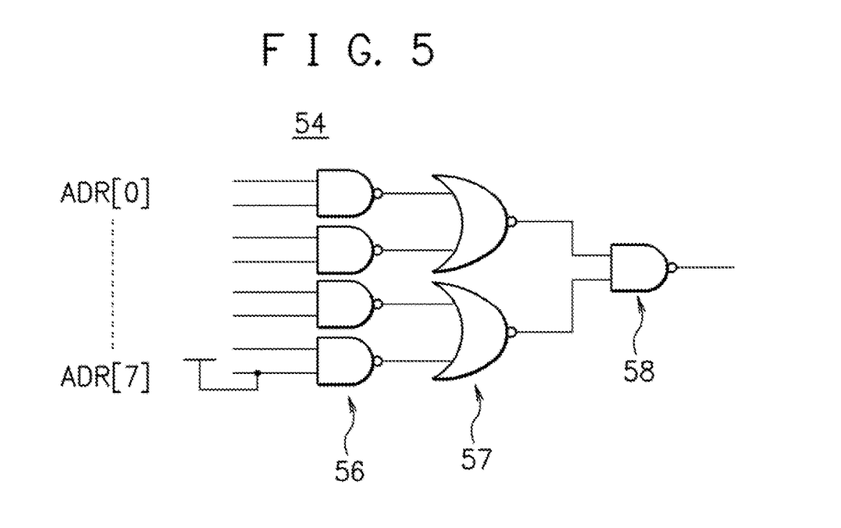
FIG. 5 is a diagram illustrating an example of an address check circuit in this embodiment.

In FIG. 5, an example of the address check circuit 54 is illustrated. The address check circuit 54 illustrated in FIG. 5 is the one corresponding to the maximum value. The address check circuit 54 performs logical operation for an output ADR (8 bits of ADR[0] to ADR[7] in the example illustrated in FIG. 5) from the address counter 53 in a NAND circuit 56, performs logical operation for outputs from the NAND circuit 56 in a NOR circuit 57, performs logical operation for outputs from the NOR circuit 57 in a NAND circuit 58, and outputs an output from the NAND circuit 58 as the end signal. In other words, the address check circuit 54 illustrated in FIG. 5 outputs the end signal (low level, "0") when all of inputs to the NAND circuit 56 are high level ("1"). In this embodiment, when the memory circuit 12 with the built-in memory circuit is generated by a compiler, the maximum value is set by performing wiring clipping (clipping at high level in the example illustrated in FIG. 5) according to an address (the number of address signals) used in the memory circuit.

The generating circuit 55 of the expected value and test data pattern generates the expected value EPD, and the write data signal WDT and the data mask signal DM which are inputted to the memory circuit, on the basis of state information outputted from the control circuit 51 and address information outputted from the address generating circuit 52.

As illustrated in FIG. 3, the comparator (COMP.) 26 includes a selector 33 and a comparator 34. The selector 33 selects and outputs a write data signal SWDT to be supplied from the system logic circuit 11 or the write data signal TWDT to be supplied from the test pattern generator 32. The selector 33, in response to the memory BIST operation control signal MT, selects and outputs the write data signal SWDT from the system logic circuit 11 in the normal operation (in the system operation), and selects and outputs the write data signal TWDT from the test pattern generator 32 in the memory BIST operation.

The comparator 34 compares whether or not an output (read data) OUT from the memory circuit matches the expected value EP from the test pattern generator 32 in the memory BIST operation. When the output OUT from the memory circuit does not match the expected value EP, the comparator 34 holds information thereof. The information held in the comparator 34 is read, for example, by scan operation at certain timing (for example, after execution of all the test patterns).

The clock pulse generator (CPG) 23 includes a predecoder 35 and a pulse generator 36. The predecoder 35 activates an output (predecoder line) on the basis of outputs AD, EN from the selector 31 of the BIST pattern generator 25 and a word line selection pulse WLP from the pulse generator 36. The pulse generator 36 generates and outputs the word line selection pulse WLP, a sense amplifier enable pulse SEP, a write circuit enable pulse WEP and so on.

The main decoder 24 includes decoders 37. The decoders 37 are each connected to one word line WL and, in response to the output (predecoder line) from the predecoder 35 of the clock pulse generator 23, activates the word line WL connected thereto. The cell array unit 21 includes a plurality of memory cells 38 arranged at intersection portions of the word lines WL and bit lines BL. In this embodiment, the memory cells 38 are, for example, SRAM cells.

The input/output circuit (I/O) 22 includes a sense amplifier 39, an output buffer 40, and a write circuit 41. The sense amplifier 39 operates in response to the sense amplifier enable pulse SEP to be generated by the pulse generator 36 of the clock pulse generator 23, and senses data read by the bit line BL. The output buffer 40 outputs the data (read data) sensed by the sense amplifier 39 as the output OUT. The write circuit 41 operates in response to the write circuit enable pulse WEP to be generated by the pulse generator 36 of the clock pulse generator 23, and controls an electric potential of the bit line BL in response to write data WDT to be inputted thereinto.

Figure 6:
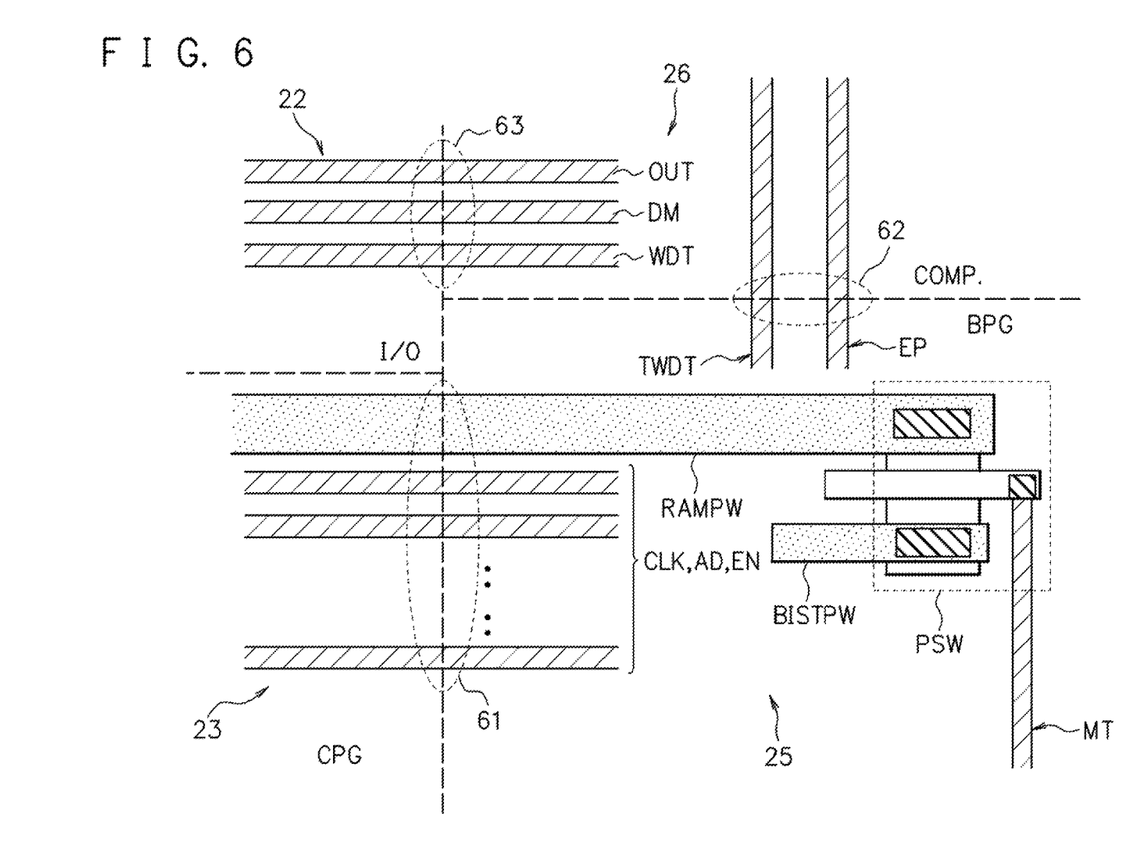
FIG. 6 is a diagram illustrating a wiring layout example of blocks of the memory circuit with the built-in memory BIST circuit in this embodiment.

In the memory circuit 12 with the built-in memory BIST circuit in this embodiment, blocks of the input/output circuit (I/O) 22 and the clock pulse generator (CPG) 23 in the memory circuit and the BIST pattern generator (BPG) 25 and the comparator (COMP.) 26 in the memory BIST circuit are laid out so that wiring of signals to be inputted/outputted respectively between the blocks is connected by an arrangement of the blocks as illustrated in FIG. 6.

More specifically, between the clock pulse generator 23 and the BIST pattern generator 25, as illustrated as a connection part 61 in FIG. 6, the block of the clock pulse generator 23 and the block of the BIST pattern generator 25 are arranged adjacently, whereby the wiring of a power supply line RAMPW of the memory circuit, the clock signal CLK, the address signal AD, the enable signal EN and so on is connected.

Between the BIST pattern generator 25 and the comparator 26, as illustrated as a connection part 62 in FIG. 6, the block of the BIST pattern generator 25 and the block of the comparator 26 are arranged adjacently, whereby the wiring of the write data signal TWDT, the expected value EP and so on is connected. Between the input/output circuit 22 and the comparator 26, as illustrated as a connection part 63 in FIG. 6, the block of the input/output circuit 22 and the block of the comparator 26 are arranged adjacently, whereby the wiring of the output signal OUT, the write data signal WDT, the data mask signal DM and so on is connected.

In the BIST pattern generator 25, the power supply line RAMPW of the memory circuit and a power supply line BISTPW of the BIST circuit are connected via a power switch PSW, so that operating power for the BIST circuit is obtained from the power supply line RAMPW of the memory circuit. Then, at a different time from that of the memory BIST operation (for example, in the normal operation (in the system operation)), the power switch PSW is set to an off-state by the memory BIST operation control signal MT to cut off power supply to the memory BIST circuit, thereby making it possible to reduce power consumption.

Figure 7:
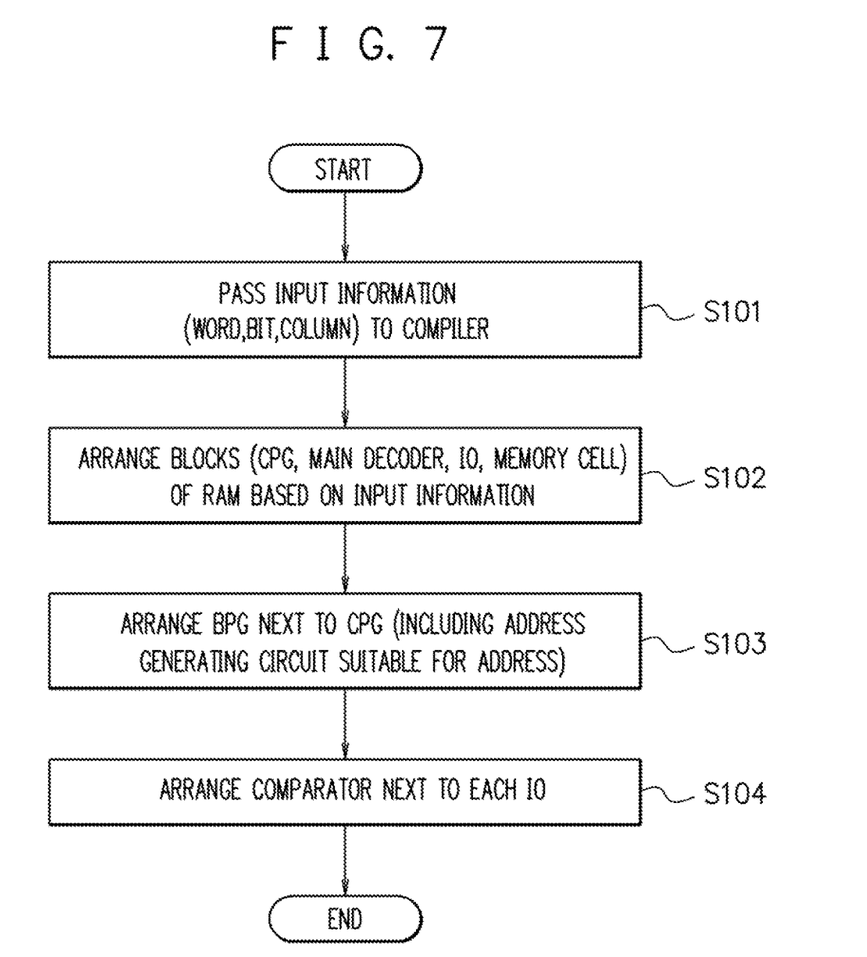
FIG. 7 is a flowchart illustrating an example of a designing method of the semiconductor device in this embodiment.

A designing method of a semiconductor device to generate the memory circuit 12 with the built-in memory BIST circuit in the embodiment will be described. FIG. 7 is a flowchart illustrating an example of the designing method of the semiconductor device in this embodiment.

Figure 8A:
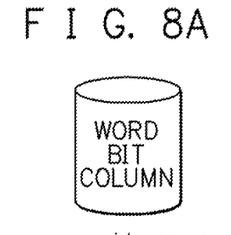
FIG. 8A to FIG. 8D are diagrams illustrating the example of the designing method of the semiconductor device in this embodiment.
Figure 8B:
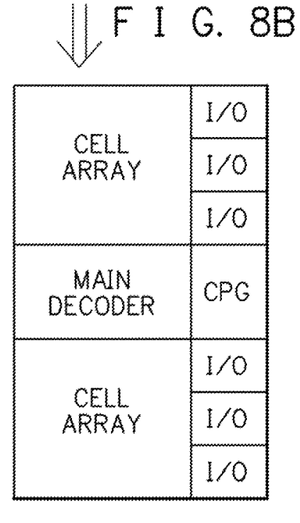

First, at step S101, as input information, the numbers of words, bits, and columns of the memory circuit 12 with the built-in memory BIST circuit to be generated are inputted and passed to the compiler (FIG. 8A). Next, at step S102, based on the input information inputted at step S101, the compiler arranges blocks of the memory circuit. More specifically, based on the input information, the compiler arranges the blocks of the clock pulse generator (CPG), the main decoder, the input/output circuits (I/O), and the cell array units (FIG. 8B).

Figure 8C:
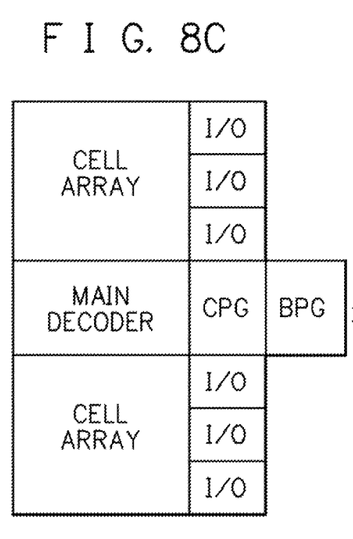

Next, at step S103, based on the input information, the compiler arranges the block of the BIST pattern generator (BPG) of the memory BIST circuit next to and in contact with the block of the clock pulse generator (CPG) (FIG. 8C). As described above, the block of the BIST pattern generator (BPG) is arranged adjacently to the clock pulse generator (CPG), whereby wiring of the signals to be transmitted is connected between the BIST pattern generator (BPG) and the clock pulse generator (CPG), resulting in that signal wiring between the BIST pattern generator (BPG) and the clock pulse generator (CPG) is automatically connected.

Further, at step S103, based on the input information, with respect to an address check circuit in the block of the BIST pattern generator (BPG), wiring clipping for setting the maximum value and the minimum value is performed in addition. This makes it possible to realize an address generating circuit suitable for an address corresponding to the input information. Note that the wiring clipping is performed by using, for example, wiring and a via on the block of the BIST pattern generator (BPG).

Figure 8D:
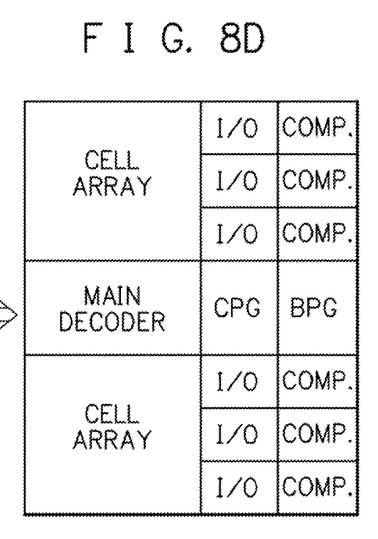

Next, at step S104, based on the input information, the compiler arranges blocks of the comparators (COMP.) of the memory BIST circuit next to and in contact with the input/output circuits (I/O) (FIG. 8D). One each of the blocks of the comparators (COMP.) is arranged with respect to one bit in input/output of the memory circuit.

As described above, the blocks of the comparators (COMP.) are arranged adjacently to the input/output circuits (I/O), whereby wiring of the signals to be transmitted is connected between the comparators (COMP.) and the input/output circuits (I/O), resulting in that signal wiring between the comparators (COMP.) and the input/output circuits (I/O) is automatically connected. Further, the blocks of the comparators (COMP.) adjacent to the block of the BIST pattern generator (BPG) and the blocks of the comparators (COMP.) adjacent to each other at the top and the bottom are arranged side by side, whereby wiring of the control signal and the like from the BIST pattern generator (BPG) is similarly and automatically connected.

Note that the designing method of the semiconductor device illustrated in FIG. 7 and FIG. 8A to FIG. 8D is an example, and is not limited thereto. When the numbers of words, bits, and columns of the memory circuit 12 with the built-in memory BIST circuit to be generated are inputted as the input information, a configuration and the like of each block are determined, and therefore, a similar semiconductor device is obtained even when processing operations at steps S102, S103, and S104 illustrated in FIG. 7 are executed in arbitrary order.

According to this embodiment, effects as in the following are obtained.

(1) TAT (Turn Around Time) Improvement for a Designer of a Memory Circuit and a Memory BIST Circuit In a conventional method, there is a need to design a memory BIST circuit individually so as to correspond to configurations of the numbers of words, bits, and columns of a memory circuit. On the other hand, according to this embodiment, it becomes possible to generate design of the memory circuit and the memory BIST circuit automatically by application of a compiler, so that the memory circuit with the built-in memory BIST circuit can be easily created.

(2) TAT Improvement for a Chip Designer

By building the memory BIST circuit in the memory circuit, in an arrangement and wiring phase of a chip layout, instances of several hundreds to several thousands unit cells constituting the memory circuit and the memory BIST circuit are integrated, so that the number of instances is greatly decreased. This improves the convergence in the arrangement and wiring of the chip layout and is effective in TAT reduction.

(3) Area Reduction by Integrating the Memory Circuit and the Memory BIST Circuit By building the memory BIST circuit in the memory circuit, it becomes possible to reduce a region provided between the memory circuits in order to arrange the memory BIST circuit, where the unit cells can be placed, so that chip area reduction becomes possible. For example, conventionally, power is supplied to the memory BIST circuit from power to be supplied to the region where the unit cells can be placed, but it is possible to supply the power from power of the memory circuit according to this embodiment, and therefore, a wiring channel for the power dropped on the region where the unit cells can be placed becomes available as wiring of the chip. Further, TAPs are made common as well as the need for providing an interval between wells as illustrated in FIG. 12 is eliminated, whereby the area can be reduced. Further, for example, the wiring becomes short by building the memory BIST circuit in the memory circuit to improve the wiring characteristic.

Further, by building the memory BIST circuit in the memory circuit, it is possible to cut off power supply to the memory BIST circuit except at a time of a shipping test, and it becomes possible to reduce standby power requirement. By building the memory BIST circuit in the memory circuit, a data line can be separately arranged on a layout, which eliminates a possibility of a short circuit, and there is no need to provide a test pattern for detecting the short circuit, so that it becomes possible to simplify the test pattern.

Note that the above-described block arrangement example in the memory circuit with the built-in memory BIST circuit is an example, is not limited thereto, and the block arrangement may be arrangements as illustrated in FIG. 9A to FIG. 9E with which effects similar to that of the above-described embodiment can be obtained. FIG. 9A to FIG. 9E are diagrams illustrating other block arrangement examples in the memory circuit with the built-in memory BIST circuit in this embodiment. In these FIG. 9A to FIG. 9E, components being the same functions as those of components illustrated in FIG. 2 and the like are denoted by the same reference signs, and redundant descriptions are omitted.

Figure 9A:
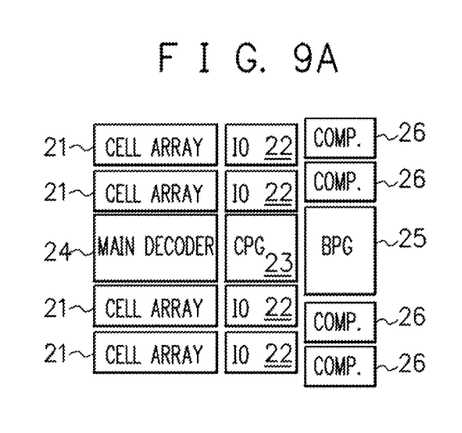
FIG. 9A to FIG. 9E are diagrams illustrating arrangement examples of blocks of the memory circuit with the built-in memory BIST circuit in this embodiment.
Figure 9B:
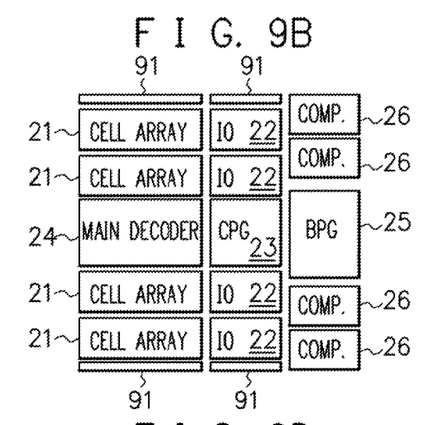

The example of the block arrangement in the memory circuit with the built-in memory BIST circuit illustrated in FIG. 2 indicates an example in which the width of the BIST pattern generator (BPG) 25 of the memory BIST circuit is the same as the width of the main decoder (MAIN DEC) 24. Without being limited to the above, in a range where the comparators (COMP.) 26 of the memory BIST circuit to be arranged with a pitch similar to that of the input/output circuits (I/O) 22 of the memory circuit can be arranged such that the comparator (COMP.) 26 is in partial contact with the input/output circuit 22 corresponding thereto as illustrated, for example, in FIG. 9A and FIG. 9B, the width of the BIST pattern generator 25 may be larger than the width of the main decoder 24. As illustrated in FIG. 9B, in regions in which the comparators (COMP.) 26 protrude at ends of the memory circuit, blocks 91 of dummy cells and dummy wiring (dummy metal) are provided, whereby a shape may be formed into a rectangle.

Figures 9C, 9D:
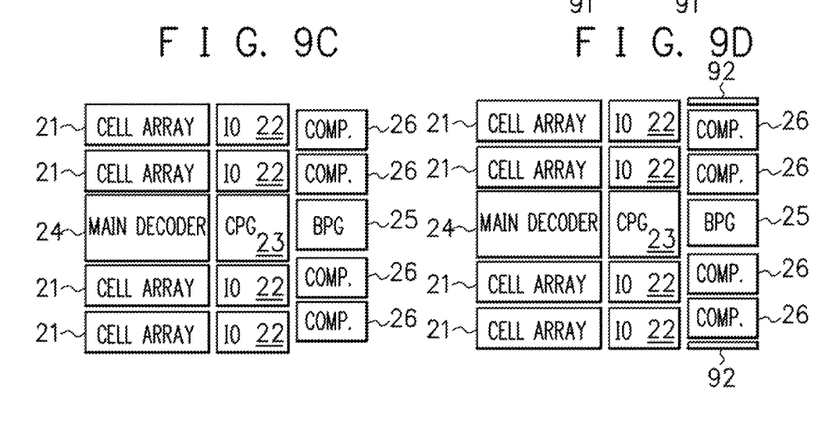
Figure 9E:
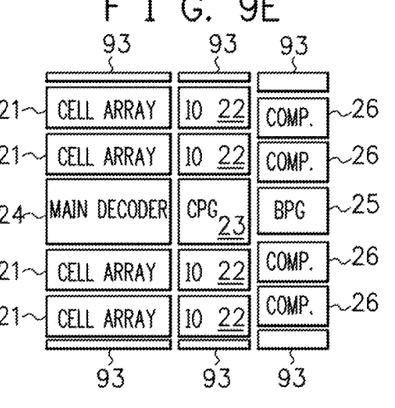

Further, in a range where the comparators (COMP.) 26 of the memory BIST circuit to be arranged with a pitch similar to that of the input/output circuits (I/O) 22 of the memory circuit can be arranged such that the comparator (COMP.) 26 is in partial contact with the input/output circuit 22 corresponding thereto, the width of the BIST pattern generator 25 may be smaller than the width of the main decoder 24, for example, as illustrated in FIG. 9C, FIG. 9D, and FIG. 9E. As illustrated in FIG. 9D and FIG. 9E, blocks 92, 93 of dummy cells and dummy wiring (dummy metal) are appropriately provided, whereby a shape may be formed into a rectangle.

Further, the designing method of the semiconductor device in the above-described embodiment can be realized, for example, by a computer including a CPU or an MPU, a RAM, a ROM and the like executing a program stored in its storage unit, and the above program is included in an embodiment. Further, the designing method of the semiconductor device in the above-described embodiment can be realized by recording a program which is made to run so that the computer performs the above functions, for example, on a recording medium such as a CD-ROM and by making the computer read the program, and the recording medium which has the above program recorded thereon is included in an embodiment. As the recording medium which records the above program, a flexible disk, a hard disk, a magnetic tape, a magnetic-optical disk, a nonvolatile memory card and the like can be used other than the CD-ROM.

Further, a program product in which the functions in the above embodiment are realized by the computer executing the program and performing processing is included in an embodiment. As the above program product, there are a program itself which realizes the functions in the above embodiment and a computer by which the above program is read. Further, as the above program product, there are a transmitting device which can provide the above program for a computer connected to be able to communicate via a network, a network system which is provided with the transmitting device, and the like.

Further, also when the functions in the above embodiment are realized in cooperation with an OS (operating system), other application software or the like in which a provided program runs on a computer, the program is included in an embodiment. Further, also when the whole or a part of processing of the provided program is performed by a function expansion board and a function expansion unit in a computer and thereby the functions in the above embodiment are realized, the program is included in an embodiment. Further, in order to utilize this embodiment in a network environment, all or a part of programs may be executed by other computers.

Figure 13:
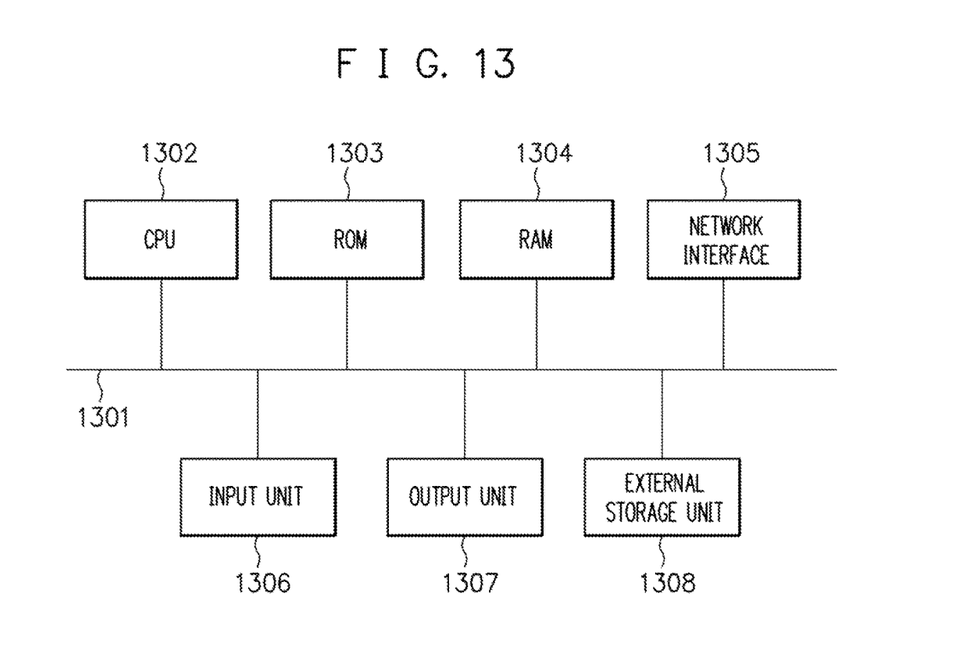
FIG. 13 is a diagram illustrating a configuration example of a computer capable of realizing the designing method of the semiconductor device in this embodiment.

For example, the designing method of the semiconductor device in the above-described embodiment can be realized by a computer (designing device) as illustrated in FIG. 13, and the operations of the designing method of the semiconductor device in the above-described embodiment are performed by its CPU (Central Processing Unit). FIG. 13 is a diagram illustrating a configuration example of the computer to be able to realize the designing method of the semiconductor device in this embodiment. A CPU 1302, a ROM (Read Only Memory) 1303, a RAM (Random Access Memory) 1304, a network interface 1305, an input unit 1306, an output unit 1307, and an external storage unit 1308 are connected to a bus 1301.

The CPU 1302 is the one which controls each of components connected thereto via the bus 1301 as well as performs data processing and operation. In the ROM 1303, a boot program is stored in advance, and the CPU 1302 executes this boot program, whereby the computer is activated. A computer program is stored in the external storage unit 1308, and the computer program is copied by the RAM 1304 and executed by the CPU 1302, whereby, for example, each processing and the like for the above-described designing method of the semiconductor device are performed. The RAM 1304 is used as input/output of data, a work memory for transmission/reception, and temporary storage for control of each of components.

The external storage unit 1308 is, for example, a hard disk storage device, a CD-ROM or the like, and storage contents therein are not erased even when power supply is cut off. The network interface 1305 is an interface for connecting to the network. The input unit 1306 is, for example, a keyboard, a pointing device (mouse) or the like and can perform various kinds of designation, input and the like. The output unit 1307 is a display, a printer or the like and can perform display, printing or the like.

Note that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

It becomes possible to automatically generate a memory circuit with a built-in memory BIST circuit, and there is no need to individually design a memory BIST circuit, so that it becomes possible to easily design a semiconductor device including the memory circuit and the memory BIST circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A semiconductor device comprising a memory circuit with a memory built-in self test circuit therein,
the memory circuit including:
a pulse generator;

a plurality of input and output circuits configured to input and output data and being arranged adjacently to the pulse generator in a first direction and each of the plurality of input and output circuits being corresponding to each of bits of the data to be inputted and outputted;

a pattern generator of the memory built-in self test circuit configured to perform generation of a test pattern and being arranged adjacently to the pulse generator in a second direction different from the first direction, between the pattern generator and the pulse generator wiring of a signal to be transmitted being connected by being arranged adjacently to the pulse generator; and a same number of a plurality of comparators of the memory built-in self test circuit as a number of the plurality of input and output circuits, each of the plurality of comparators being configured to compare an output value to be supplied from each of the input and output circuits respectively and an expected value to be supplied from the pattern generator, the plurality of comparators being arranged adjacently to the plurality of input and output circuits in the second direction with a same pitch as a pitch of the plurality of input and output circuits, between the plurality of comparators and the plurality of input and output circuits wirings of signals to be transmitted being connected by being arranged adjacently to the plurality of input and output circuits.

2. The semiconductor device according to claim 1, wherein the pattern generator includes an address counter configured to generate an address to be used for a test and a check circuit configured to limit the address generated by the address counter in accordance with the memory circuit.

3. The semiconductor device according to claim 1, wherein the pattern generator includes a power switch configured to supply power to the memory built-in self test circuit at a time of a test and to cut off supply of the power to the memory built-in self test circuit except at the time of the test.

* * * * *